US010825626B2

(12) United States Patent
Broadwell et al.

(10) Patent No.: US 10,825,626 B2
(45) Date of Patent: Nov. 3, 2020

(54) FAULT TOLERANT SOLENOID ACTUATION AND MONITORING

(71) Applicant: Safran Electrical & Power, Blagnac (FR)

(72) Inventors: James Broadwell, Parrish, FL (US); Christopher Kenneth Wyatt, Bradenton, FL (US); Dean Morgan, Lakeland, FL (US)

(73) Assignee: SAFRAN ELECTRICAL & POWER, Blagnac (FR)

( * ) Notice: Subject to any disclaimer, the term of this patent is extended or adjusted under 35 U.S.C. 154(b) by 183 days.

(21) Appl. No.: 16/056,849

(22) Filed: Aug. 7, 2018

(65) Prior Publication Data
US 2019/0051479 A1    Feb. 14, 2019

Related U.S. Application Data

(60) Provisional application No. 62/543,134, filed on Aug. 9, 2017.

(51) Int. Cl.
| H01H 47/00 | (2006.01) |
| G01R 31/50 | (2020.01) |
| G01R 31/327 | (2006.01) |
| H03K 21/08 | (2006.01) |

(52) U.S. Cl.
CPC ....... *H01H 47/002* (2013.01); *G01R 31/3278* (2013.01); *G01R 31/50* (2020.01); *H03K 21/08* (2013.01)

(58) Field of Classification Search
USPC .................................................. 324/418–424
See application file for complete search history.

(56) References Cited

U.S. PATENT DOCUMENTS

| 5,243,296 | A | * | 9/1993 | Ando | G01R 31/2829 |
| | | | | | 324/546 |
| 6,317,458 | B1 | | 11/2001 | Boggs et al. | |
| 6,326,898 | B1 | | 12/2001 | O'Leyar et al. | |
| 2007/0182367 | A1 | * | 8/2007 | Partovi | H01F 5/003 |
| | | | | | 320/108 |
| 2015/0229122 | A1 | | 8/2015 | Siemss et al. | |

FOREIGN PATENT DOCUMENTS

DE    102014202678    8/2015

OTHER PUBLICATIONS

International Search Report and Written Opinion dated Nov. 21, 2018, 35 pages.

* cited by examiner

*Primary Examiner* — Vincent Q Nguyen
(74) *Attorney, Agent, or Firm* — Rankin, Hill & Clark LLP

(57) ABSTRACT

According to one or more aspects, a health sense system for a pulse width modulation (PWM) device associated with a magnetic coil is provided, and includes a health sense circuit, a health logic circuit, and a counter circuit. The health sense circuit measures one or more current measurements at a low voltage side of the pulse width modulation device. The health logic circuit determines a health bit indicative of a health score for the magnetic coil of the pulse width modulation device based on one or more of the current measurements. The counter circuit generates a feedback command for the pulse width modulation device based on the health bit.

18 Claims, 5 Drawing Sheets

FAULT TOLERANT SOLENOID ACTUATION AND MONITORING

BACKGROUND

Pulse width modulation (PWM) for current control in relays or contactors may mitigate weight of a part and wasted energy. However, a defective magnetic coil may cause problems for the relays or contactors. Further, because pulse width modulation may be utilized in a variety of controlled applications, such as heater blowers, lamps, vehicles, etc., control of power supplied to a corresponding electrical device may be interrupted when a coil becomes defective.

BRIEF DESCRIPTION

According to one or more aspects, a health sense system for a pulse width modulation (PWM) device associated with a magnetic coil includes a health sense circuit measuring one or more current measurements at a low voltage side of the pulse width modulation device, a health logic circuit determining a health bit indicative of a health score for the magnetic coil of the pulse width modulation device based on one or more of the current measurements, and a counter circuit generating a feedback command for the pulse width modulation device based on the health bit.

A '0' value for the health bit is indicative of a failing health score and a '1' value for the health bit is indicative of a passing health score. One or more of the current measurements is utilized to calculate a change in magnetic flux associated with the pulse width modulation device. The health sense system may include one or more peak detectors, which include at least a diode, an operational amplifier, and a capacitor. The peak detectors compares one or more of the current measurements against an expected current level. The health sense system may include a steering diode steering back emf to the pulse width modulation device. The counter circuit counts a number of resets associated with the pulse width modulation device. The counter circuit generates the feedback command based on the number of resets associated with the pulse width modulation device. The pulse width modulation device may include a field effect transistor (FET). The health sense system may be in a closed loop configuration with the PWM device. The health sense circuit may measure one or more of the current measurements across a current sense resistor.

According to one or more aspects, a health sense system for a pulse width modulation (PWM) device associated with a magnetic coil may include a health sense circuit measuring one or more current measurements at a low voltage side of the pulse width modulation device, a health logic circuit determining a health bit indicative of a health score for the magnetic coil of the pulse width modulation device based on one or more of the current measurements, and a counter circuit generating a feedback command for the pulse width modulation device based on the health bit, wherein the health sense system is in a closed loop configuration with the PWM device.

According to one or more aspects, a health sense system for a pulse width modulation (PWM) device associated with a magnetic coil may include a health sense circuit measuring one or more current measurements across a current sense resistor at a low voltage side of the pulse width modulation device, a health logic circuit determining a health bit indicative of a health score for the magnetic coil of the pulse width modulation device based on one or more of the current measurements, and a counter circuit generating a feedback command for the pulse width modulation device based on the health bit.

DETAILED DESCRIPTION

Figure 1:
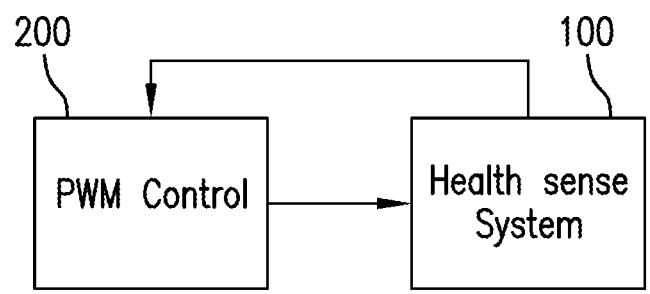
FIG. 1 is an illustration of an example implementation of a health sense system, according to one or more embodiments.

FIG. 1 is an illustration of an example implementation of a health sense system 100, according to one or more embodiments. The health sense system 100 may monitor a pulse width modulation control system 200. For example, the health sense system 100 may monitor or detect a moving plunger on a magnetic actuated relay or contactor of the pulse width modulation control system 200. The health sense system 100 may determine a health score for the pulse width modulation control system 200 based on the detected moving plunger on the magnetic actuated relay or contactor. Based on the health score, the health sense system 100 may issue one or more commands to restart, activate, or deactivate the contactor of the pulse width modulation control system 200 or otherwise shut the contactor off.

As seen in FIG. 1, a feedback loop is formed between the health sense system 100 and the pulse width modulation control system 200. The health sense system 100 may monitor the relay or contactor of the pulse width modulation control system 200 and provide control feedback to the pulse width modulation control system 200 based on one or more sets of monitored information. For example, the health sense system 100 may monitor or detect a change in magnetic flux or flux associated with back-emf of the relay or the contactor of the pulse width modulation control system 200, as will be described in greater detail below. In one or more embodiments, the health sense system 100 may activate or re-activate the contactor or relay of the pulse width modulation control system 200 at one or more different time intervals, based on one or more attempts, or until a threshold number of attempts to re-activate are reached.

As used herein, back-emf may refer to a voltage, or electromotive force, that pushes or fights against a current which induces it, such as a voltage that occurs in an electric motor when there is relative motion between an armature of the electric motor and the magnetic field from field magnets, coils, or windings of the motor.

The health sense system 100 may be packaged based on one or more thermal characteristics or aspects of the pulse width modulation control system 200 so as to mitigate overheating of one or more components of the health sense system 100 from heat associated with the pulse width modulation control system 200. In this regard, FIG. 2 illustrates the health sense system in greater detail.

Figure 2:
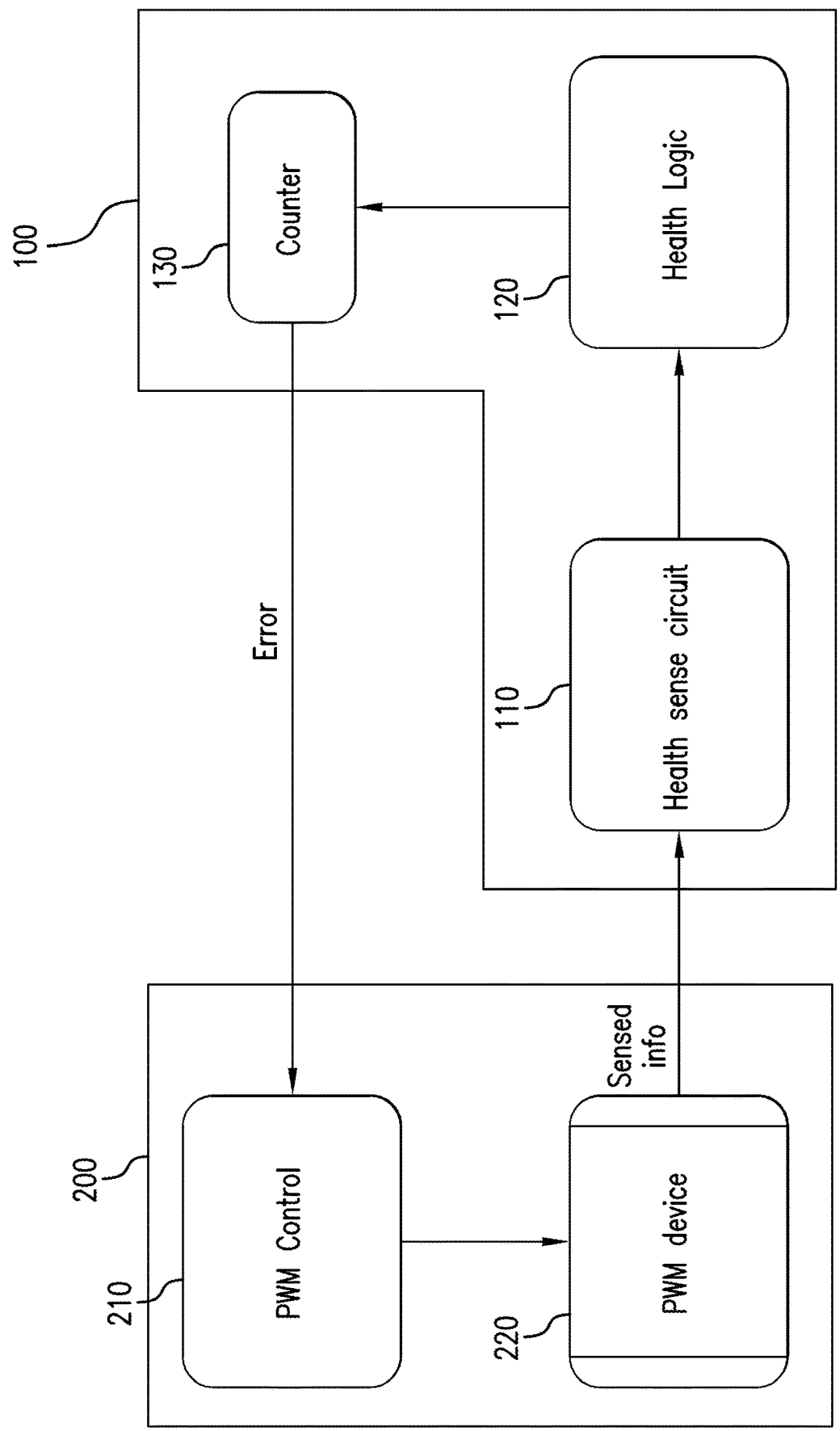
FIG. 2 is an illustration of an example implementation of a health sense circuit, according to one or more embodiments.

FIG. 2 is an illustration of an example implementation of a health sense system 100, according to one or more embodiments. In FIG. 2, the pulse width modulation control system 200 provides sensed information to the health sense system 100, which in turn, utilizes the closed loop configuration to provide a feedback command to the pulse width modulation control system 200.

The pulse width modulation control system 200 may include a pulse width modulation controller 210 and a pulse width modulation device 220. The pulse width modulation device 220 may be a third party pulse width modulation device, such as a field effect transistor (FET) including a magnetically actuated relay or contactor and a magnetic coil or a solenoid coil, and the pulse width modulation controller 210 may be a device which provides pulse width modulation control for pulse width modulation devices with solenoids, relays, or contactors.

The pulse width modulation controller 210 may generate one or more feedback commands based on signals from the counter circuit 130 and operate the pulse width modulation device 220 accordingly. For example, the pulse width modulation controller 210 may generate a reset command, a shut-off command, a restart command, a continue operation command, etc. based on the signal from the counter circuit 130 and command the pulse width modulation device 220 to reset, shut off, restart, or proceed with continued operation, respectively. The pulse width modulation controller 210 may store a status of the pulse width modulation device 220 as a status bit at a memory or a storage unit of the health sense system 100 (or the pulse width modulation control system 200).

The health sense system 100 may include a health sense circuit 110, a health logic circuit 120, and a counter circuit 130. In one or more embodiments, the health sense system 100 may include (not shown) one or more processors, one or more processing units (e.g., computing devices), one or more memories, one or more storage devices, storage units, or storage devices (e.g., RAM, ROM, etc.).

The health sense circuit 110 may detect a change in magnetic flux of a closing or moving contactor or relay of the pulse width modulation device 220. The health sense circuit 110 may measure a current using a low side sense resistor on the pulse width modulation device 220. The health sense circuit 110 may measure current at a low side (e.g., the low side is a return side or low voltage side of a solenoid coil, relay, or contactor) of the pulse width modulation device 220. In any event, the health sense circuit 110 may sense a moving plunger for a magnetic actuated relay or contactor (and associated change of inductance) and determine the associated change in magnetic flux based on one or more current measurements at the return side of the coil, contactor, or relay of the pulse width modulation device 220.

In one or more embodiments, the health sense circuit 110 may include one or more peak detectors and a steering diode which places back-emf back on the pulse width modulation device 220 and may be an analog circuit, as will be described in greater detail in FIG. 3. The peak detectors enable detection of solenoid coil or plunger movement for the magnetic actuated relay or contactor, and thus, movement tracking for the pulse width modulation device 220. In this way, a peak level measurement may be taken. If the peak level measurement is not detected or does not meet one or more criteria, the health logic circuit 120 may determine or calculate a failing health score for the pulse width modulation device 220, and the counter circuit 130 may attempt to reset or restart the solenoid coil, contactor, or relay of the pulse width modulation device 220 based on the failing health score or health bit.

The health logic circuit 120 may calculate a health score for the contactor or the relay of the pulse width modulation device 220 based on the detected change in magnetic flux (e.g., from the health sense circuit 110) or based on the measured current. In one or more embodiments, the health logic circuit 120 may calculate the health score based on current measured across a resistor (e.g., R13 of FIGS. 4-5). For example, if the change in magnetic flux is greater than a magnetic flux change threshold, then the health score may be calculated to be a passing health score. This health score may be translated to or stored as a logic state or a health bit. For example, the health logic circuit 120 may include a memory or a storage drive storing the health score or the logic state or health bit associated with the health score for the contactor or the relay of the pulse width modulation device 220.

The health score may be expressed or recorded as a health bit, which is associated with one of two logic states (e.g., 0 or 1). As an example, 0=restart, and 1=normal operation. The health score or health bit may be used by the pulse width modulation controller 210 to determine whether to restart, enable, or disable the pulse width modulation device 220, relay, or contactor.

The counter circuit 130 may count or track a number of resets, restarts, or shut-offs for the pulse width modulation device 220 (e.g., this count may be in association with the health score or merely a count of a total number of resets which may or may not necessarily be associated with the health score). The counter circuit 130 may determine or generate one or more signals for the pulse width modulation device 220 based on the health score, a health score threshold, a reset counter, or a reset counter threshold.

For example, if the health score is less than the health score threshold, the counter circuit 130 may pass this information (e.g., the failing health score) on to pulse width modulation controller 210 to shut the pulse width modulation device 220 off (e.g., or otherwise deactivate the pulse width modulation device 220) or a feedback command ordering the pulse width modulation controller 210 to reset or re-activate the pulse width modulation device 220. In FIG. 2, the counter circuit 130 is depicted as generating an error signal indicative of the health score being less than the health score threshold, thereby resulting in the PWM controller 210 restarting or shutting the PWM device 220 down.

However, it will be appreciated that other scenarios may be possible, such as no error signal being generated if the health score is greater than or equal to the health score threshold. In such a scenario, operation of the pulse width modulation device 220 or the pulse width modulation control system 200 continues or is maintained (e.g., 'normal' operation continues). As used herein, an 'error' or error signal may be generated based on a scenario where the health score is less than the health score threshold (e.g., a failing health score) or based on the reset counter exceeding or being greater than the reset counter threshold. The reset counter threshold may be a number of times that the health sense system 100 may order the pulse width modulation controller 210 to reset or re-activate the pulse width modulation device 220 prior to providing a shut off or shut down signal. This reset counter threshold may be hard-coded into a memory or a storage unit of the health sense system 100. An example of the reset counter threshold may be three, according to one or more aspects.

As previously discussed, when the reset counter exceeds the reset counter threshold, a maximum number of allowable reset or re-established connection attempts is reached, prompting the counter logic or circuit 130 to command the pulse width modulation controller 210 to shut off the pulse width modulation device 220 and report this failure or error via a status bit, stored to the memory or the storage unit of the health sense system 100 (or the pulse width modulation control system 200). In one or more embodiments, there is a threshold number of attempts, which when reached, which will cause the pulse width modulation controller 210 to shut the pulse width modulation device 220 off, and report a failure by assigning a status bit a corresponding failed value (e.g., '0').

In one or more embodiments, the status bit may be assigned a '0' value to have the pulse width modulation controller 210 restart or reset the pulse width modulation device 220 and a '1' value to have the pulse width modulation controller 210 continue or maintain operation of the pulse width modulation device 220.

In one or more embodiments, the pulse width modulation controller 210 may include logic which stops restart attempts after a threshold number of attempts, such as three, is reached, for example. In other words, when the counter reaches a threshold number of shutoffs, restarts, or restart attempts (e.g., 3 attempts), regardless of the health bit, the pulse width modulation controller 210 will shut the pulse width modulation device 220 off, and report the failure by assigning the status bit a corresponding failed value.

As another example, if the health score is less than the health score threshold and the reset counter is greater than the reset counter threshold, the counter circuit 130 may generate a feedback command ordering the pulse width modulation controller 210 to shut the pulse width modulation device 220 off (e.g., or otherwise deactivate the pulse width modulation device 220). The reset counter may be a value or a bit stored in a memory or storage unit indicative of a number of times that the pulse width modulation device 220 has been reset or reset in connection with the health score being less than the health score threshold. In this way, the counter circuit 130 may be utilized to mitigate an infinite reset loop scenario for the pulse width modulation device 220 or the pulse width modulation control system 200.

In one or more embodiments, the counter circuit 130 or the pulse width modulation controller 210 may implement a delay (e.g., using a countdown timer circuit) prior to resetting, restarting, etc. the pulse width modulation device 220 or the pulse width modulation control system 200. For example, in a scenario where coil activation is 47 ms, the counter circuit 130 or the pulse width modulation controller 210 may implement a 20 ms delay, due to a lag in detection. Thereafter, the coil, relay, or contactor of the pulse width modulation device 220 is re-activated by the pulse width modulation controller 210.

Figure 3:
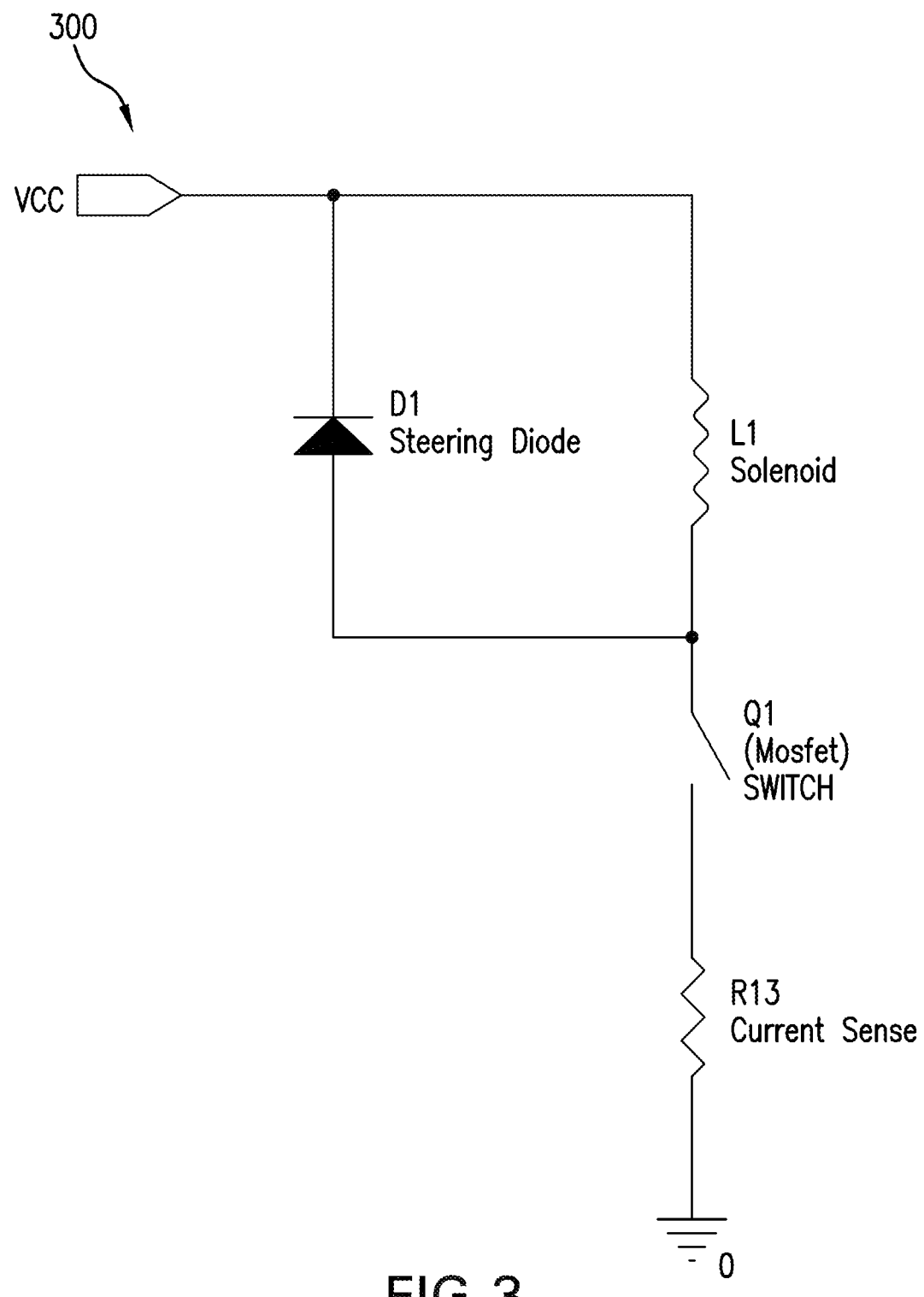
FIG. 3 is an illustration of an example implementation of a current measuring circuit, according to one or more embodiments.

FIG. 3 is an illustration of an example implementation of a current measuring circuit 300, according to one or more embodiments. FIG. 3 is a representation of a MOSFET Q1 and external coil L1 (or the contactor magnetic coil). In FIG. 3, the current measuring circuit 300 includes a steering diode D1 in parallel with the solenoid L1 such that a first end of D1 is connected to a first end of L1 and a second end of D1 is connected to a second end of L1, a switch Q1, having a first end connected to the second ends of D1 and L1, and a first end of a current sense resistor R13 connected to a second end of the switch Q1 and a second end of R13 connected to ground. In this example, R13 may be utilized to measure the current associated with the solenoid L1 (e.g., magnetic coil). In other words, R13 is the resistor which is measured differentially to determine if the contactor L1 closes or opens. In this way, R13 is used to detect the health of the contactor magnetic circuit.

Figure 4:
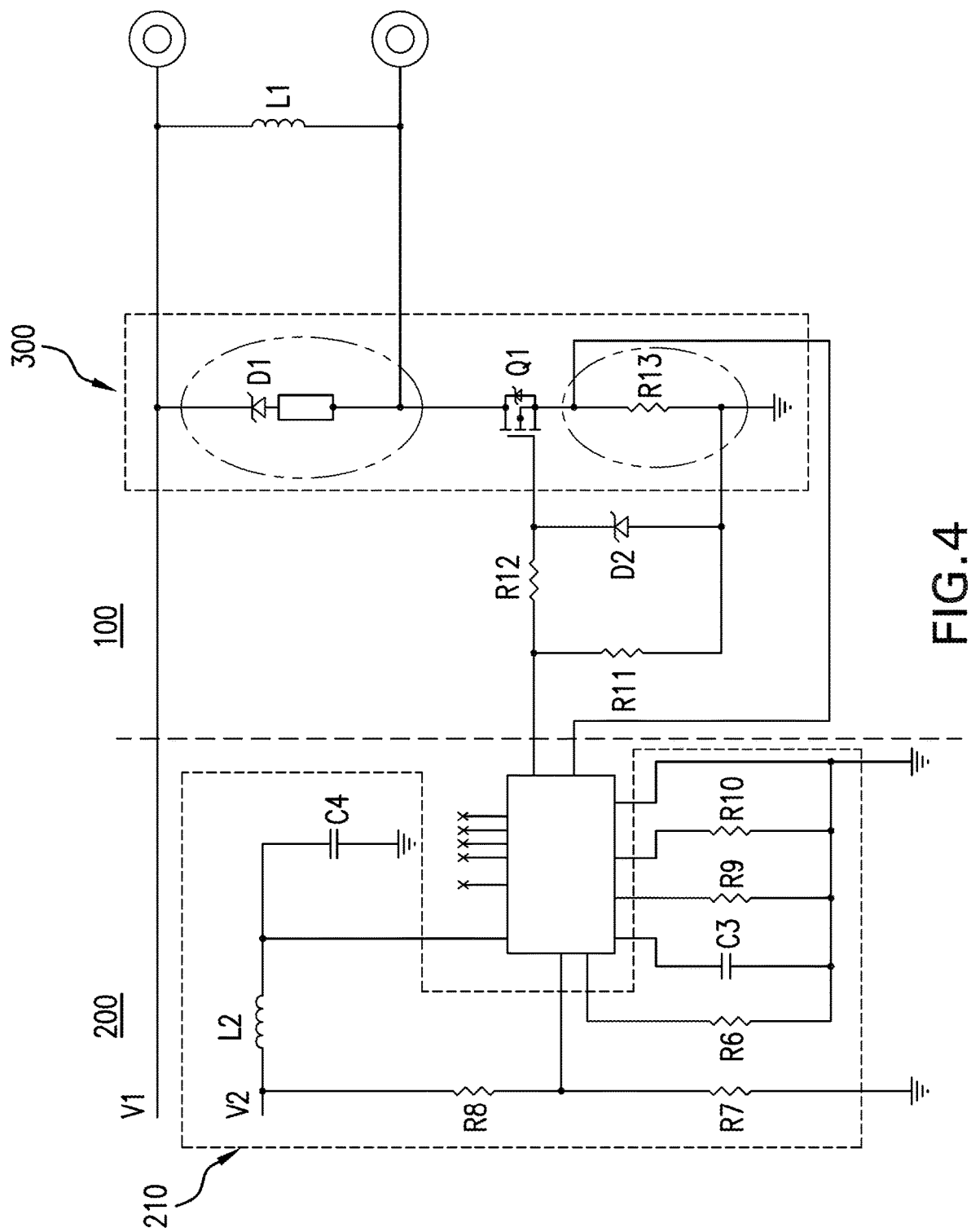
FIG. 4 is an illustration of an example implementation of a health sense circuit, according to one or more embodiments.

FIG. 4 is an illustration of an example implementation of a health sense circuit, according to one or more embodiments. In FIG. 4, the components left of the dashed line are associated with the pulse width modulation control system 200, while the components to the right of the dashed line are associated with the health sense system 100.

In FIG. 4, V1 may be set to 28 volts and V2 may be set to 12 volts through a voltage regulator (not shown). V1 goes to the inductor or solenoid L1. As mentioned, the output of the voltage regulator may be 12 volts, which is tied to L2 (to help regulate the voltage) and R8. C4, which is tied to L2, acts as energy storage while the pulse width modulation device 220 is operating. R8 is tied to R7 and the pulse width modulation device 220. Together R7 and R8 are configured as a voltage divider which may turn the pulse width modulation device 220 on and/or off. For example, the resistor values of R7 and R8 may be set to disable the pulse width modulation device 220 at under 5 volts. In any event, R7 and R8 may be set as a voltage divider which controls on/off operation of the pulse width modulation device 220. R6, C3, R9, and R10 are all tied to and provide support for the pulse width modulation device 220. For example, the value of R6 determined a frequency at which the pulse width modulation device 220 is pulse width modulating. The value of C3 determines a length of time full power is provided until the pulse width modulation device 220 begins pulse width modulation. R9 sets up a peak current allowed during a time when the pulse width modulation device 220 is not pulse width modulating.

A first end of a resistor R11 may be connected to a first end of a resistor R12. A second end of resistor R12 may be connected to a first end of a diode D2. A second end of resistor R11 may be connected to a second end of the diode D2, ground, and a second end of resistor R13. In this way, R11 acts as a pulldown resistor (e.g., a hard pulldown for the output of the PWM transition from high to low) because it is connected to the gate of Q1 and ground. A first end of R13 may be connected to the source side or low side of Q1. The gate of Q1 is connected to the second end of R12 and the first end of the diode D2. Thus, R12 is the gate resistor for Q1, which may be a MOSFET for pulse width modulation. D2 may act as a protection device so that Q1 does not get over voltage.

The drain side of Q1 is connected to a second end of the steering diode D1. The first end of the steering diode D1 may be connected to the input bus. In one or more embodiments, the steering diode D1 may be a Schottky diode. That is, D1 may have a breakdown voltage which is configured such that over voltage of Q1 is not possible. In one or more embodiments, a steering diode D1 may steer emf created by switching an inductor (e.g., the coil of the contactor, which is external to the circuit of FIG. 4, and is positioned (not shown) in parallel to D1 on the right) back onto an input bus. Further, D1 may also limit the peak current.

Resistor R13 is a current measuring resistor, measuring the current at the low side (e.g., at the return side or the low voltage side) of Q1. In this example, the high side of Q1 is the drain side of Q1, while the low side of Q1 is the source side of Q1 and the differential of R13 may be measured by the pulse width modulation device 220 (e.g., to the left of the dashed lines in FIG. 4). In this way, R13 may be utilized to measure current, and in turn, determine a change in magnetic flux of a closing or moving contactor or relay of the pulse width modulation device 220. The measured current may be associated with a waveform which may be analyzed to determine the change in flux because the magnetic field and electric current are related, thereby enabling detection of the health of the solenoid L1, which is connected to the top side of the steering diode D1 and the bottom side of the steering diode D1.

Peak detectors may be utilized in one or more embodiments, as will be described in FIG. 5. For example, peak detectors may process the measured current and compare the measured current against an expected current level. If the measure current is not within a range of the expected current level, the health logic circuit 120 may generate a failing health score or assign a health status bit as '0' for the pulse width modulation control system 200, thereby resulting in an error or a reset attempt.

Figure 5:
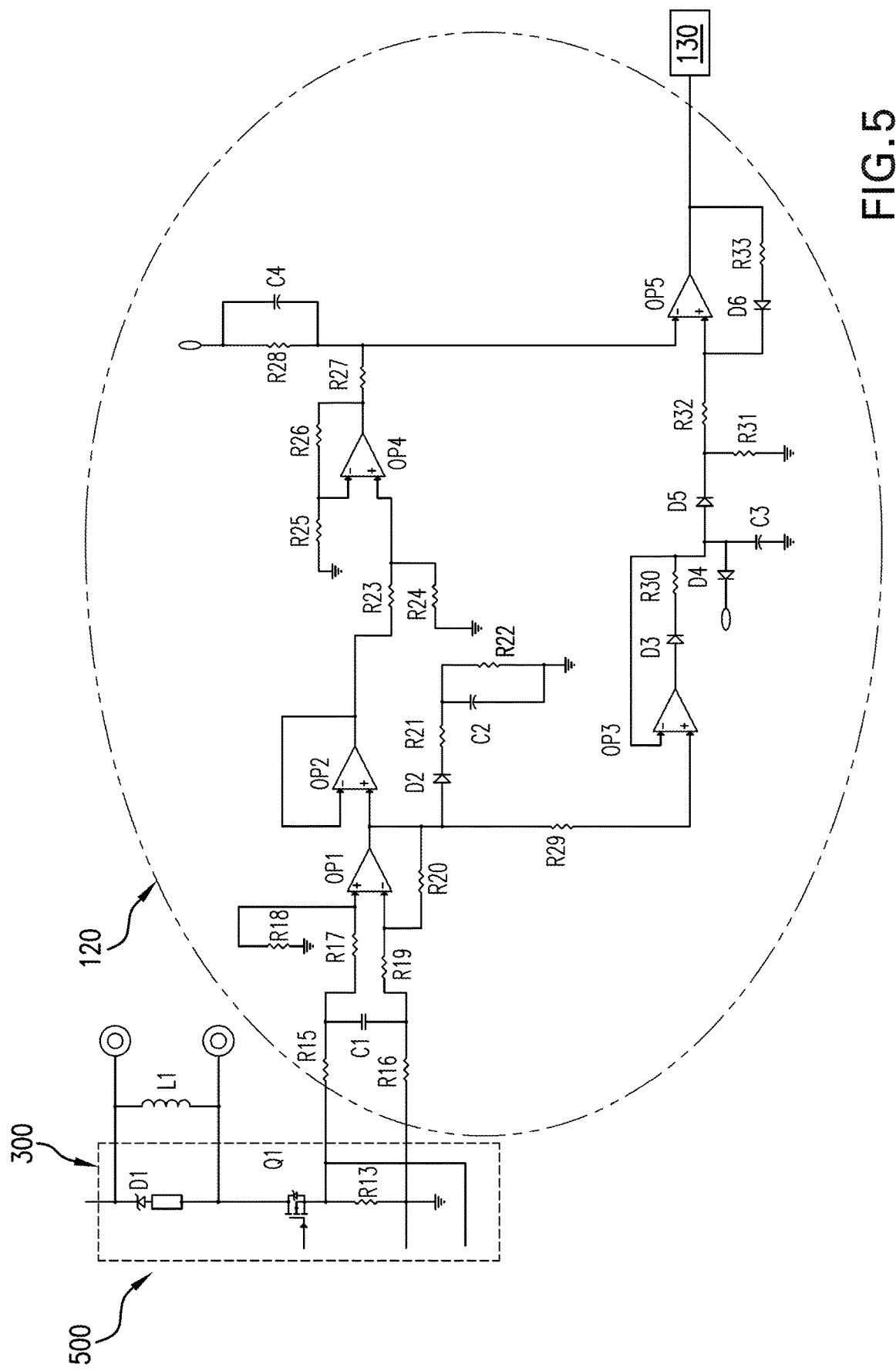
FIG. 5 is an illustration of an example implementation of a health sense circuit, according to one or more embodiments.

FIG. 5 is an illustration of an example implementation of a health sense circuit, according to one or more embodiments. In FIG. 5, R13 is the current sense resistor and a coil fault detection and fault trip circuit is provided. As seen in FIG. 5, the steering diode D1 (e.g., from FIG. 4) may steer emf created by switching the inductor of FIG. 4 back onto the input bus.

The fault trip circuit or health logic circuit 120 may include R15-R33, D2-D6, one or more capacitors C1-C4, one or more operational amplifiers OP1-OP5, etc. For example, a first end of R15 may be connected to a first end of R13, a second end of R15 may be connected to a first end of C1 and a first end of R17. A first end of R16 may be connected to a second end of R13, a second end of R16 may be connected to a second end of C1 and a first end of R19. A second end of R17 may be connected to a first end of R18 and an input to a first operational amplifier OP1. A second end of R19 may be connected to an input of OP1 and a first end of R20, which is connected to the output of OP1. The output of OP1 is also connected to an input of OP2, a first end of D2, and an input of OP3. The second end of D2 is connected to a first end of R21. The second end of R21 is connected to a first end of C2 and R22. The second ends of C2 and R22 is connected to ground.

The output of OP3 is connected to a first end of D3. A second end of D3 is connected to a first end of R30. The second end of R30 is connected to the other input of OP3 and a first end of D4, a first end of D5, and a first end of C3. The second end of C3 is connected to ground. The second end of D5 is connected to a first end of R31 and R32. The second end of R31 is connected to ground. The second end of R32 is connected to an input of OP5 and a second end of D6. OP3 provides rectification of the input signal and sets up OP5.

The output of OP2 is connected to one of the inputs of OP2. The output of OP2 is connected to a first end of R23. The second end of R23 is connected to a first end of R24. The second end of R24 is connected to ground. The second end of R23 and the first end of R24 is connected to an input of OP4. The output of OP4 is connected to a first end of R27 and a first end of R26. The second end of R26 is connected to a first end of R25 and one of the inputs of OP4. The second end of R25 is connected to ground. The second end of R27 is connected to one of the inputs of OP5, a first end of R28, and a first end of C4. The second ends of R28 and C4 are connected. The circuitry associated with OP2 and OP4 function as the peak detectors discussed herein.

The output of OP5 is connected to a first end of R33. The second end of R33 is connected to a first end of D6. The second end of D6 is connected to one of the inputs of OP5.

In FIG. 5, 120 is a peak level detection circuit or logic which supports a go or no go decision based on a timer (which is not represented), which is otherwise the health logic circuitry of FIG. 2.

It will be appreciated that the circuits, systems, or methods described herein may be applicable to health detection for contact health, coil health, controller health, incoming power health, etc.

Although the subject matter has been described in language specific to structural features or methodological acts, it is to be understood that the subject matter of the appended claims is not necessarily limited to the specific features or acts described above. Rather, the specific features and acts described above are disclosed as example embodiments.

Various operations of embodiments are provided herein. The order in which one or more or all of the operations are described should not be construed as to imply that these operations are necessarily order dependent. Alternative ordering will be appreciated based on this description. Further, not all operations may necessarily be present in each embodiment provided herein.

As used in this application, "or" is intended to mean an inclusive "or" rather than an exclusive "or". Further, an inclusive "or" may include any combination thereof (e.g., A, B, or any combination thereof). In addition, "a" and "an" as used in this application are generally construed to mean "one or more" unless specified otherwise or clear from context to be directed to a singular form. Additionally, at least one of A and B and/or the like generally means A or B or both A and B. Further, to the extent that "includes", "having", "has", "with", or variants thereof are used in either the detailed description or the claims, such terms are intended to be inclusive in a manner similar to the term "comprising".

Further, unless specified otherwise, "first", "second", or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or two identical channels or the same channel. Additionally, "comprising", "comprises", "including", "includes", or the like generally means comprising or including, but not limited to.

It will be appreciated that various of the above-disclosed and other features and functions, or alternatives or varieties thereof, may be desirably combined into many other different systems or applications. Also that various presently unforeseen or unanticipated alternatives, modifications, variations or improvements therein may be subsequently made by those skilled in the art which are also intended to be encompassed by the following claims.

The invention claimed is:

1. A health sense system for a pulse width modulation (PWM) device associated with a magnetic coil, comprising:
    a health sense circuit measuring one or more current measurements at a low voltage side of the pulse width modulation device;
    a health logic circuit determining a health bit indicative of a health score for the magnetic coil of the pulse width modulation device based on one or more of the current measurements;
    a counter circuit generating a feedback command for the pulse width modulation device based on the health bit; and
    a steering diode steering back emf to the pulse width modulation device, wherein the steering diode is arranged in parallel with an inductor only.

2. The health sense system of claim 1, wherein a '0' value for the health bit is indicative of a failing health score and a '1' value for the health bit is indicative of a passing health score.

3. The health sense system of claim 1, wherein one or more of the current measurements is utilized to calculate a change in magnetic flux associated with the pulse width modulation device.

4. The health sense system of claim 1, comprising one or more peak detectors comprising at least a diode, an operational amplifier, and a capacitor.

5. The health sense system of claim 1, wherein the counter circuit counts a number of resets associated with the pulse width modulation device.

6. The health sense system of claim 5, wherein the counter circuit generates the feedback command based on the number of resets associated with the pulse width modulation device.

7. The health sense system of claim 1, wherein the pulse width modulation device includes a field effect transistor (FET).

8. The health sense system of claim 1, wherein the health sense system is in a closed loop configuration with the PWM device.

9. The health sense system of claim 1, wherein the health sense circuit measures one or more of the current measurements across a current sense resistor.

10. A health sense system for a pulse width modulation (PWM) device associated with a magnetic coil, comprising:
a health sense circuit measuring one or more current measurements at a low voltage side of the pulse width modulation device;
a health logic circuit determining a health bit indicative of a health score for the magnetic coil of the pulse width modulation device based on one or more of the current measurements;
a counter circuit generating a feedback command for the pulse width modulation device based on the health bit, wherein the health sense system is in a closed loop configuration with the PWM device; and
a steering diode steering back emf to the pulse width modulation device, wherein the steering diode is arranged in parallel with an inductor only.

11. The health sense system of claim 10, wherein a '0' value for the health bit is indicative of a failing health score and a '1' value for the health bit is indicative of a passing health score.

12. The health sense system of claim 10, wherein one or more of the current measurements is utilized to calculate a change in magnetic flux associated with the pulse width modulation device.

13. The health sense system of claim 10, comprising one or more peak detectors comprising at least a diode, an operational amplifier, and a capacitor comparing one or more of the current measurements against an expected current level.

14. The health sense system of claim 10, wherein the counter circuit counts a number of resets associated with the pulse width modulation device.

15. A health sense system for a pulse width modulation (PWM) device associated with a magnetic coil, comprising:
a health sense circuit measuring one or more current measurements across a current sense resistor at a low voltage side of the pulse width modulation device;
a health logic circuit determining a health bit indicative of a health score for the magnetic coil of the pulse width modulation device based on one or more of the current measurements;
a counter circuit generating a feedback command for the pulse width modulation device based on the health bit; and
a steering diode steering back emf to the pulse width modulation device, wherein the steering diode is arranged in parallel with an inductor only.

16. The health sense system of claim 15, wherein a '0' value for the health bit is indicative of a failing health score and a '1' value for the health bit is indicative of a passing health score.

17. The health sense system of claim 15, wherein one or more of the current measurements is utilized to calculate a change in magnetic flux associated with the pulse width modulation device.

18. The health sense system of claim 15, comprising one or more peak detectors comprising at least a diode, an operational amplifier, and a capacitor comparing one or more of the current measurements against an expected current level.

* * * * *